(12) United States Patent
Nguyen et al.

(10) Patent No.: US 7,442,615 B2
(45) Date of Patent: Oct. 28, 2008

(54) SEMICONDUCTOR PROCESSING SYSTEM AND METHOD

(75) Inventors: Tue Nguyen, Fremont, CA (US); Tai Dung Nguyen, Fremont, CA (US); Craig Alan Bercaw, Boulder Creek, CA (US)

(73) Assignee: Tegal Corporation, Petaluma, CA (US)

( * ) Notice: Subject to any disclaimer, the term of this patent is extended or adjusted under 35 U.S.C. 154(b) by 181 days.

(21) Appl. No.: 11/443,620

(22) Filed: May 31, 2006

(65) Prior Publication Data
US 2007/0020945 A1 Jan. 25, 2007

Related U.S. Application Data

(60) Continuation-in-part of application No. 10/403,211, filed on Apr. 1, 2003, which is a division of application No. 09/840,349, filed on Apr. 21, 2001, now Pat. No. 6,610,169.

(51) Int. Cl.
*H01L 21/336* (2006.01)
(52) U.S. Cl. .................. 438/308; 438/676; 118/711

(58) Field of Classification Search ................ 438/308, 438/676, 677, 679, 681; 118/711, 715, 719, 118/730
See application file for complete search history.

(56) References Cited

U.S. PATENT DOCUMENTS

| | | | |
|---|---|---|---|
| 5,468,341 A | 11/1995 | Samukawa | 216/69 |
| 5,705,224 A * | 1/1998 | Murota et al. | 427/248.1 |
| 5,916,365 A | 6/1999 | Sherman | 117/92 |
| 6,071,572 A * | 6/2000 | Mosely et al. | 427/570 |
| 6,200,893 B1 | 3/2001 | Sneh | 438/685 |
| 6,503,330 B1 * | 1/2003 | Sneh et al. | 118/715 |
| 2005/0037597 A1 | 2/2005 | Nguyen et al. | |
| 2005/0239240 A1 | 10/2005 | Ohtani et al. | |
| 2005/0266591 A1 | 12/2005 | Hideo | |

OTHER PUBLICATIONS

"Design Considerations for Triggering of Flashlamps," A. McLeod, http://optoelectronics.perkinelmer.com/content/whitepapers/TriggeringFlashlamps.pdf, 1998.

* cited by examiner

*Primary Examiner*—Phuc T Dang
(74) *Attorney, Agent, or Firm*—Fliesler Meyer LLP

(57) ABSTRACT

Systems and methods are disclosed to perform semiconductor processing with a process chamber; a flash lamp adapted to be repetitively triggered; and a controller coupled to the control input of the flash lamp to trigger the flash lamp. The system can deploy a solid state plasma source in parallel with the flash lamp in wafer processing.

20 Claims, 6 Drawing Sheets

SEMICONDUCTOR PROCESSING SYSTEM AND METHOD

CLAIM OF PRIORITY

This application is a continuation-in-part application of U.S. patent application Ser. No. 10/403,211, filed Apr. 1, 2003, which is a divisional application of U.S. patent application Ser. No. 09/840,349, filed Apr. 21, 2001, now U.S. Pat. No. 6,610,169.

CROSS-REFERENCE TO RELATED APPLICATION

This application is related to U.S. patent application Ser. No. 11/443,621, filed May 31, 2006, and entitled SEMICONDUCTOR PROCESSING SYSTEM AND METHOD. This application is incorporated herein in its entirety.

BACKGROUND OF INVENTION

The present invention relates to semiconductor processing.

The fabrication of modern semiconductor device structures has traditionally relied on plasma processing in a variety of operations such as etching, depositing or sputtering. Plasma etching involves using chemically active atoms or energetic ions to remove material from a substrate. Plasma Enhanced Chemical Vapor Deposition (PECVD) uses plasma to dissociate and activate chemical gas so that the substrate temperature can be reduced during deposition. Plasma sputtering also deposits materials onto substrates, where plasma ions, such as argon, impact a material surface and sputter the material that is then transported as neutral atoms to a substrate. Additional plasma processes include plasma surface cleaning and physical-vapor deposition (PVD) of various material layers.

Conventionally, plasma is generated using a radio frequency powered plasma source. In a "typical" radio frequency powered plasma source, alternating current (AC) power is rectified and switched to provide current to a RF amplifier. The RF amplifier operates at a reference frequency (13.56 MHz, for example), drives current through an output-matching network, and then through a power measurement circuit to the output of the power supply. The output match is usually designed to be connected a generator that is optimized to drive particular impedance, such as 50 ohms, in order to have the same characteristic impedance as the coaxial cables commonly used in the industry. Power flows through the matched cable sections, is measured by the match controller, and is transformed through the load match. The load match is usually a motorized automatic tuner, so the load match operation incurs a predetermined time delay before the system is properly configured. After passing through the load match, power is then channeled into a plasma excitation circuit that drives two electrodes in an evacuated processing chamber. A processing gas is introduced into the evacuated processing chamber, and when driven by the circuit, plasma is generated. Since the matching network or the load match is motorized, the response time from the matching network is typically in the order of one second or more.

Conventionally, plasma is continuously generated in order to obtain the large amount of power necessary to deposit the layers at high speed and thereby to improve the shapes of stepped parts thereof (coverage). As noted in U.S. Pat. No. 5,468,341 entitled "Plasma-etching Method and Apparatus Therefor," the amount of ion energy reaching a surface of the object to be etched in conventional RF sources can be accomplished by controlling the power of RF waves, the controllable range of dissociation process in plasmas is narrow, and, therefore, the extent of controllable etching reactions on the surface of the object wafer is narrowly limited. Also, since the magnetic fields are present in a plasma generation chamber for high-density plasmas, a magnetohydrodynamic plasma instability can exist due to, for example, drift waves generated in the plasmas, which leads to a problem wherein the ion temperature rises and the directions of ion motions become non-uniform. Further, the problems include a degradation of a gate oxide film and a distortion of etching profile due to the charges accumulated on the wafer.

In a deposition technology known as atomic layer deposition (ALD), various gases are injected into the chamber for about 100-500 milliseconds in alternating sequences. For example, a first gas is delivered into the chamber for about 500 milliseconds and the substrate is heated, then the first gas (heat optional) is turned off. Another gas is delivered into the chamber for another 500 milliseconds (heat optional) before the gas is turned off. The next gas is delivered for about 500 milliseconds (and optionally heated) before it is turned off. This sequence is done until all gases have been cycled through the chamber, each gas sequence forming a monolayer which is highly conformal. ALD technology thus pulses gas injection and heating sequences that are between 100 and 500 milliseconds. This approach has a high dissociation energy requirement to break the bonds in the various precursor gases such as silane and oxygen and, thus, requires that the substrate to be heated to a high temperature, for example, in the order of 600-800 degrees Celsius for silane and oxygen processes.

SUMMARY OF INVENTION

In one aspect, an apparatus to perform semiconductor processing includes a process chamber; a flash lamp adapted to be repetitively triggered; and, a controller coupled to the control input of the flash lamp to trigger the flash lamp.

Implementations of the above aspect may include one or more of the following. The flash lamp can be pulsed to perform atomic layer processing, which includes one or more of the following: deposition, etching, epitaxial deposition, and sputter deposition. A solid state plasma generator employing frequency tuning can be used to achieve output matching. The plasma generator can be a solid state generator without any moving parts and having a short tuning response time. The solid state generator includes: a switching power supply; an amplifier coupled to the power supply; a reference frequency generator coupled to the amplifier; a power measurement circuit providing feedback to a comparator and to the reference frequency generator; an output match section coupled to the power measurement circuit; and, a plasma excitation circuit coupled to the output match section. A plurality of precursor inlets can be coupled to the chamber, and the precursor from the precursor inlets reacts when the flash lamp is triggered. The controller can be computer controlled or can be a hardwired circuit. The controller turns on the flash lamp in an atomic layer process. The controller can cycle the flash lamp multiple times to perform atomic layer processing in the process chamber. The multiple layers can be plasma-assisted layers and non plasma-assisted layers.

In another aspect, a method to deposit multi-layer films on a semiconductor includes introducing a gas into a processing chamber; and, triggering a flash lamp to generate thermal energy in the chamber to deposit a layer.

Implementations of this aspect may include one or more of the following. The method includes purging the chamber and then sequentially pulsing the flash lamp for each layer to be deposited.

In yet another aspect, a multi-layer semiconductor processing chamber includes a gas source coupled to the chamber for introducing a processing gas into a reaction chamber having a sample disposed therein; a high intensity flash lamp coupled to the chamber to react the processing gas; and, a controller coupled to the flash lamp to trigger the flash lamp for each deposited layer.

Implementations of the above aspect may include one or more of the following. A solid state RF plasma source can be used in conjunction with the flash lamp, the source including: a switching power supply; an RF amplifier coupled to the power supply; a reference frequency generator coupled to the RF amplifier; a power measurement circuit providing feedback to a comparator and to the reference frequency generator; and, an output match section coupled to the power measurement circuit; and a plasma excitation circuit coupled to the output match section. The controller triggers the flash lamp and/or pulses the solid state RF plasma source. The controller sequentially triggers the flash lamp and/or pulses the solid state RF plasma source for each layer to be deposited.

Advantages of the system may include one or more of the following. The system can instantaneously deliver a significant amount of energy to the wafer surface to initiate a desirable surface reaction. The system can perform a combination of pulsed plasma and/or flash heating to thermally activate chemical precursors on the surface of the substrate at temperatures slightly below that required to initiate a sustained thermal reaction. This technique can be used to build extremely thin layers of material for Atomic Layer Deposition processes. The system offers better control thickness. Customer can use thinner films to achieve the same result, thereby extending Moore's law. The resulting high quality films possess superior properties such as high uniformity, controlled resistivity, high diffusion resistance, and high conformality, among others. Thus, the system enables high precision etching, deposition or sputtering performance. The pulse modulation of a flash bulb and/or a radio frequency powered plasma source enables a tight control the radical production ratio in plasmas, the ion temperature and the charge accumulation. Also, since the time for accumulation of charges in a wafer is on the order of milli-seconds and the accumulation of charges to the wafer is suppressed by the pulse-modulated plasma on the order of micro-seconds, this enables the suppression of damage to devices on the wafer caused by the charge accumulation and of notches caused during the electrode etching process. The system allows the substrate be heated to a relatively low temperature, typically less than 400 degrees Celsius. The processing of the wafer at lower temperatures can reduce the thermal budget and can be advantageous in reducing thermally induced mechanical stresses, diffusion alloying of adjacent layers within the substrate, and minimizing grain growth, among others.

Other advantages may include one or more of the following. The system attains highly efficient plasma operation in a compact substrate process module that can attain excellent characteristics for etching, depositing or sputtering of semiconductor wafers as represented by high etch rate, high uniformity, high selectivity, high anisotropy, and low damage. The system achieves high density and highly uniform plasma operation at low pressure for etching substrates and for deposition of films on to substrates. Additionally, the system is capable of operating with a wide variety of gases and combinations of gases, including highly reactive and corrosive gases.

DETAILED DESCRIPTION

Figure 1:
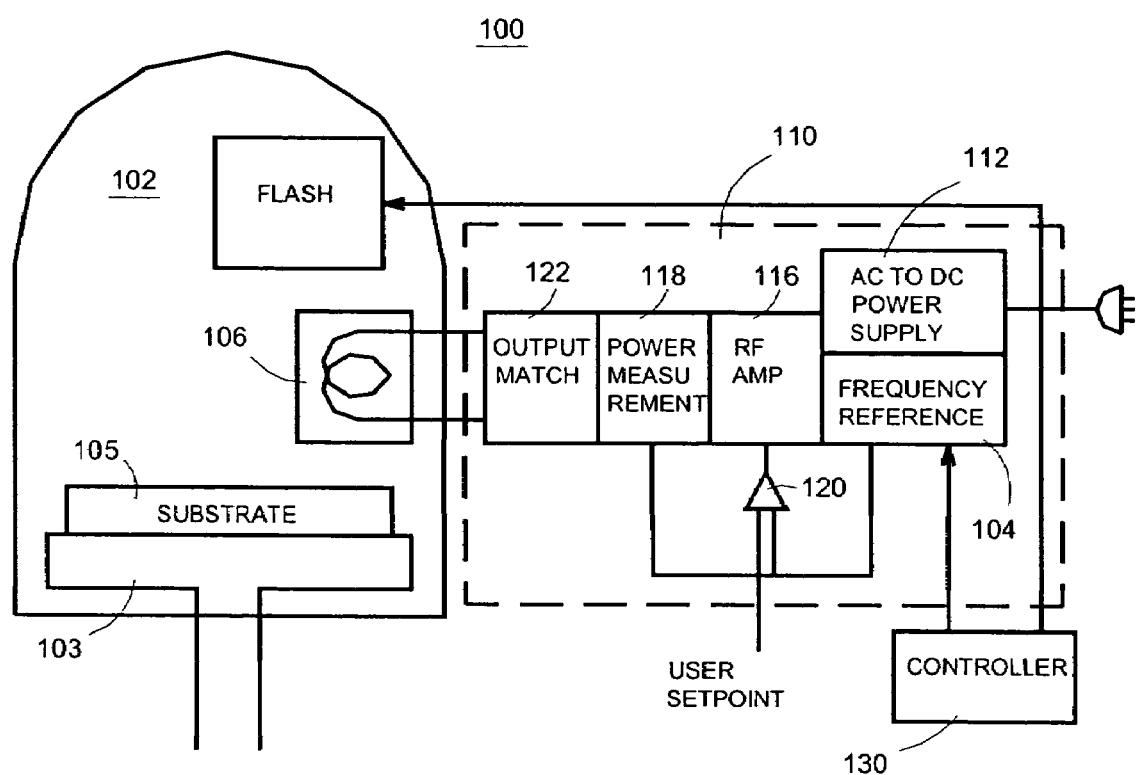
FIG. 1 shows an exemplary pulsed processing system with a processing chamber.

FIG. 1 shows an exemplary pulsed processing system 100 with a processing chamber 102. The processing chamber 102 has a chamber body enclosing components of the processing chamber such as a chuck 103 supporting a substrate 105. The processing chamber typically maintains vacuum and provides a sealed environment for process gases during substrate processing. On occasions, the process chamber needs to be periodically accessed to cleanse the chamber and to remove unwanted materials cumulating in the chamber. To support maintenance for the process chamber, an opening is typically provided at the top of the process chamber that is sufficiently large to provide access to the internal components of the process chamber.

The chamber 102 includes a plasma excitation circuit 106 driven by a solid-state plasma generator 110 with fast ignition capability. One commercially available plasma source is the Litmas source, available from LITMAS Worldwide of Matthews, N.C. The generator 110 includes a switching power supply 112 that is connected to an alternating current (AC) line. The power supply 112 rectifies AC input and switches the AC input to drive an RF amplifier 116. The RF amplifier 116 operates at a reference frequency (13.56 MHz, for example) provided by a reference frequency generator 104. The RF amplifier 116 drives current through a power measurement circuit 118 that provides feedback signals to a comparator 120 and to the reference frequency generator 104. In this embodiment, power is measured only once, and the information is used to control the RF amplifier 116 gain, as well as a tuning system if needed. Power is then delivered to an output match section 122, which directly drives the plasma excitation circuit 106. In one embodiment, the plasma excitation circuit 106 uses parallel plate electrodes in the chamber. However, other equivalent circuits can be used, including an external electrode of capacitance coupling or inductance coupling type, for example.

A controller 130 generates a periodic pulse and drives one input of the frequency reference 104. The pulse effectively turns on, or off, the plasma generation. One embodiment of the controller 130 generates a pulse with a frequency of ten hertz (10 Hz) or less. In another embodiment, the pulse generated has a pulse-width of approximately two hundred fifty (250) millisecond and the pulse is repeated approximately every fifty (50) microseconds.

The chamber 102 includes one or more flash lamps 113 controlled by the controller 130 to heat the substrate. Various commercially available flash lamps can be used. In one embodiment, Xenon flash lamps (bulbs or tubes) are used to emit large amounts of spectral energy in short duration pulses. A number of suitable flash lamps known to those skilled in the art may be used. For example, as discussed in Alex D. McLeod's article entitled "Design Considerations for Triggering of Flash lamps," Copyright 1998-2003 PerkinElmer, Inc., power supply energy accumulates in a storage capacitor. When this energy is released and dissipated it forms highly excited xenon plasma within the flash lamp. The energy released covers a wide spectral range from ultraviolet (UV) to infrared (IR), closely resembling sunlight. The charged energy-storage-capacitor is normally connected across the two main electrodes (commonly called anode and cathode) of the flash lamp. The voltage to which this capacitor is charged is usually lower than that which would cause the xenon to ionize.

The process that effects the initial ionization is known as triggering, which creates a voltage gradient (Volts/Inch) in the gas of sufficient magnitude to cause ionization. Most triggering schemes use a trigger transformer to produce high voltage pulses of short duration. Several different circuits have been developed which introduce this voltage to achieve ionization. Once this has occurred, as evidenced by a thin streamer between the main electrodes, a conductive path exists through which the energy-storage-capacitor can discharge. As the level of ionization increases, the streamer increases in cross-section and produces an intense flash.

A number of triggering methods can be used, including external, series injection, and pseudo-series injection. These three triggering methods can be triggered by simmer or pseudo-simmer mode circuits. The simmer mode technique requires that the flash lamp be triggered only once in a sequence of flashes. A separate power supply with a specially designed load characteristic is used to force the current to continue flowing in the lamp in a low, but stable state of ionization. Depending on the flash lamp type, typical simmer current may be from 100 milliamps up to several amperes. The voltage across the lamp will be 100 to 150 volts. The main discharge energy, obtained from a capacitor charged to a separate power supply, may now be switched into the lamp. A semiconductor switch, such as an SCR or a gas or vacuum gap may also be used. The gas in the lamp will become more highly ionized, producing a flash as the energy is dissipated. The gas will then be forced to return to the simmer state. Care must be taken in circuit design and layout, that transients due to parasitic elements do not cause deionization to occur, or that semiconductors or insulation do not become over stressed. Pseudo simmer mode is a variation on the simmer mode circuit that combines the simmer power supply with the capacitor charging supply. Operating conditions are limited by lamp and power supply load line considerations.

In one embodiment with external triggering, a high voltage trigger pulse is used to create a thin ionized streamer between the anode and cathode within the lamp. Ionization starts when gas adjacent to the tube wall is excited by the voltage gradient induced by this high voltage pulse from the trigger transformer. A thin nickel wire can be wrapped around the surface of the glass (or quartz) envelope (tube) and touch the glass over as much as possible of the length of the envelope, between the electrode inner tips. The trigger transformer high voltage output (secondary winding) is connected to one end of this wire. The trigger voltage required to reliably trigger a particular flash lamp depends on the arc length, bore diameter, fill pressure, electrode material and is normally given in the flash lamp characteristic data. Other factors such as ambient radiant energy and aging characteristics of the lamp also affect triggering requirements. The trigger pulse width is important using this method because a finite amount of time is required for the ionized streamer to propagate down the bore of the flash lamp. Triggering has been found to be most reliable when the pulse width is at least 200 nanoseconds per inch of arc length.

Figure 5:
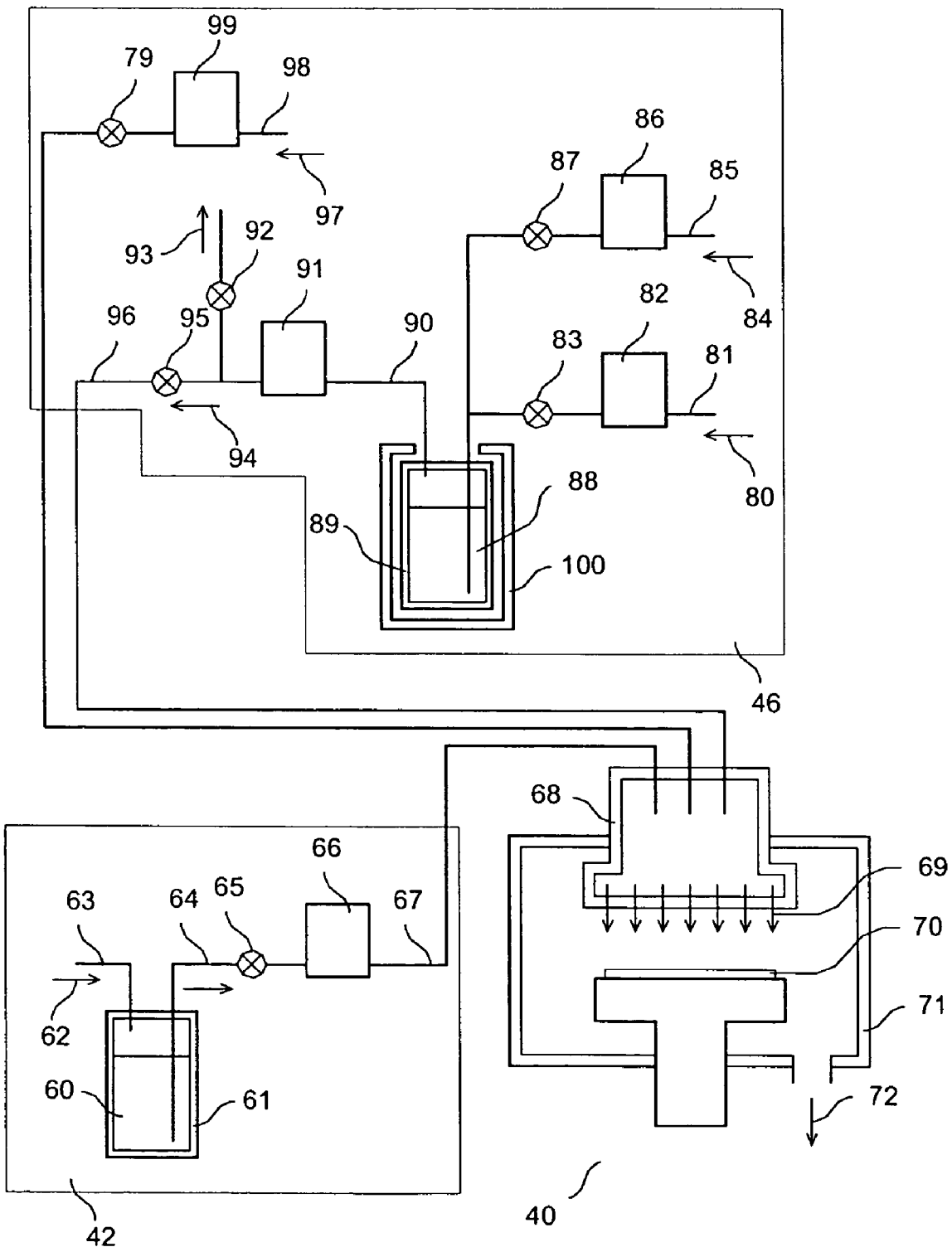
FIG. 5 shows an exemplary apparatus for liquid and vapor precursor delivery.

In another embodiment with series injection triggering, the discharge current from the energy-storage-capacitor is passed through the secondary winding of the trigger transformer. The secondary winding of the trigger transformer must therefore be designed to carry the total current of the discharge within the ambient temperature design limits. The inductance of the secondary winding (of the trigger transformer) is now part of the discharge circuit and may be utilized to control the energy-storage-capacitor's current pulse wave shape. Since flash lamp life is inversely proportional to peak current, it is desirable to optimize this inductance for damping and design a critically damped circuit. This will produce minimum peak current and prevent current reversal that may damage the flash lamp. The life of the flash lamp is now maximized for the particular energy required and the power requirement now dictates the size of the trigger transformer. Pseudo series injection triggering retains some of the advantages of series injection triggering without some of the penalties, especially those of size, weight and cost. FIG. 5 shows four versions of this circuit in various possible configurations of polarities and grounded nodes. The trigger voltage is applied to the flash lamp in the same manner as with series injection, however, in this case the main energy discharge does not flow through the trigger transformer secondary winding. Instead, a path is provided through a suitable diode.

The pulse generator 130 also generates a periodic pulse that drives the flash lamp 113. The pulse effectively turns on or off the plasma generation. One embodiment of the pulse generator 130 generates a pulse with a frequency of ten hertz (10 Hz) or less. In another embodiment, the pulse generated has a pulse-width of approximately fifty (50) millisecond and the pulse is repeated approximately every five seconds.

The characteristics of a film deposited by the above techniques are dependent upon the electron temperature in the plasma, the energy of ion incident on a substrate, and the ion and radical produced in the vicinity of an ion sheath. The electron temperature distribution in the plasma, the kind of each of the ion and radical produced in the plasma, and the ratio between the amount of the ion and the amount of the radical, can be controlled by modulating a high-frequency voltage in the same manner as having been explained with respect to the plasma etching. Accordingly, when conditions for depositing a film having excellent characteristics are known, the discharge plasma is controlled by a modulated signal according to the present invention so that the above conditions are satisfied. Thus, the processing characteristics with respect to the film deposition can be improved.

Figure 2:
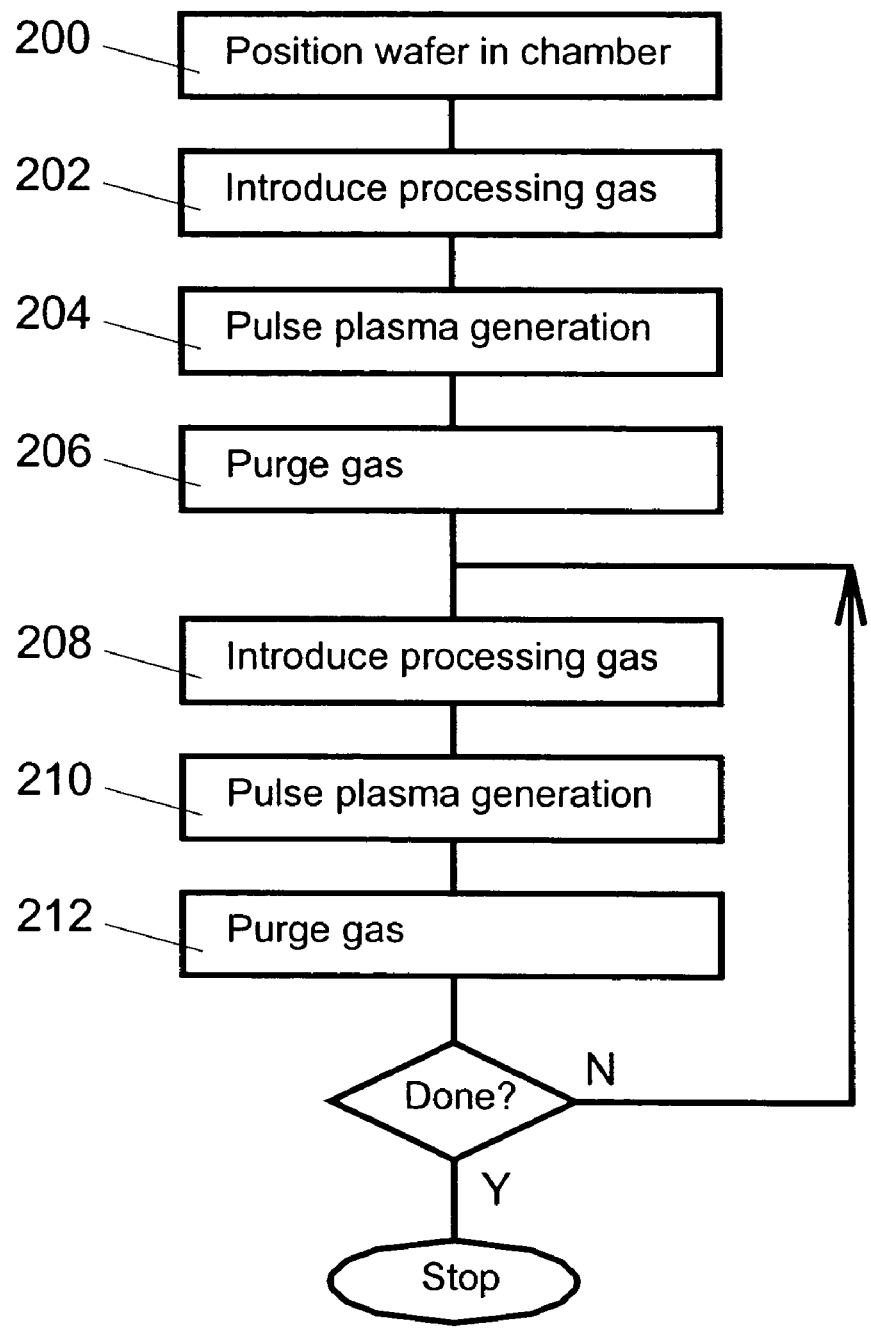
FIG. 2 shows a flowchart of one exemplary semiconductor manufacturing process using the system of FIG. 1.

FIG. 2 shows a flowchart of one exemplary semiconductor manufacturing process using the system 100 of FIG. 1. First, a wafer is positioned inside the chamber (step 200). Next, a suitable processing gas is introduced into the chamber (step 202), and the controller 130 is periodically turned on in accordance with a process activation switch to drive the desired process (step 204). The controller can activate one or more flash bulbs, one or more solid state RF heaters, or any of these two heat sources in combination and in any sequence. The particular type of process to be performed affects the process activation switch choice. The choice of activation switch for any device fabrication process, regardless of whether the process is a deposition or etch process, also may significantly affect the final semiconductor device properties. At the conclusion of the processing of one layer of material, the gas in the chamber is purged (step 206), and the chamber is ready to accept further processing. Thus, for the next layer of material, suitable processing gas is introduced into the chamber (step 208), and the controller 130 is periodically turned on to drive the desired process (step 210). At the conclusion of the processing of the second layer of material, the gas in the chamber is purged (step 212), and the chamber is ready to accept yet another layer of material. This process is repeated for each layer in the multi-layer wafer.

Figure 3A:
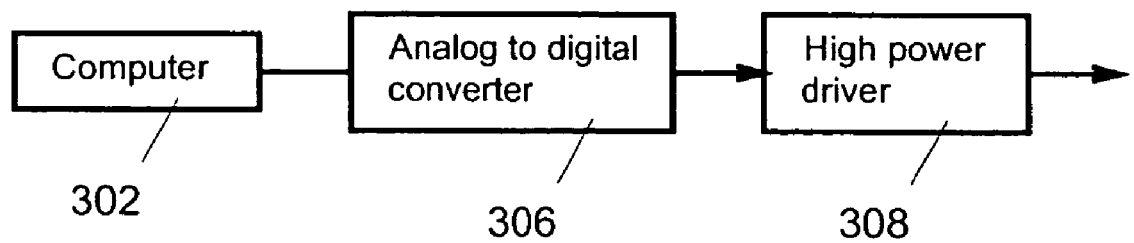
FIGS. 3A-3B show exemplary pulse generator embodiments.

FIG. 3A shows one exemplary controller 300. The controller 300 includes a computer 302 driving a digital to analog converter (DAC) 306. The DAC 306 generates shaped waveforms and is connected to a high-voltage isolation unit 308 such as a power transistor or a relay to drive the plasma generator 110. The controller 300 can generate various waveforms such as a rectangular wave and a sinusoidal wave, and, moreover, can change the period and amplitude of such waveforms. Further, in the above explanation, the RF power supplied to a plasma is modulated with a rectangular wave. However, the modulation waveform is not limited to the rectangular wave. In other words, when a desired ion energy distribution, a desired electron temperature distribution, and a desired ratio between the amount of the desired ion and the amount of the desired radical, are known, the modulation waveform is determined in accordance with these factors. The use of a rectangular wave as the modulation waveform has an advantage that a processing condition can be readily set and the plasma processing can be readily controlled. It is to be noted that since the rectangular wave modulates the signal from the RF source in a discrete fashion, the rectangular wave can readily set the processing condition, as compared with the sinusoidal wave and the compound wave of it. Further, the pulse generator can also generate amplitude modulated signals in addition to or in combination with the frequency modulated signals.

Figure 3B:
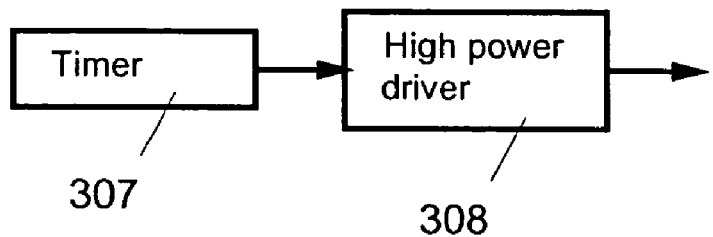

FIG. 3B shows an exemplary embodiment that uses a timer chip, such as a 555 timer, available from Signetics of Sunnyvale, Calif. The timer chip 555 is preconfigured through a suitable resistive-capacitive (RC) network to generate pulses at specified intervals. The timer chip 555 generates shaped waveforms and is connected to a high-voltage isolation unit 308, such as a power transistor or a relay, to drive the plasma generator 110, as discussed above.

Figure 4:
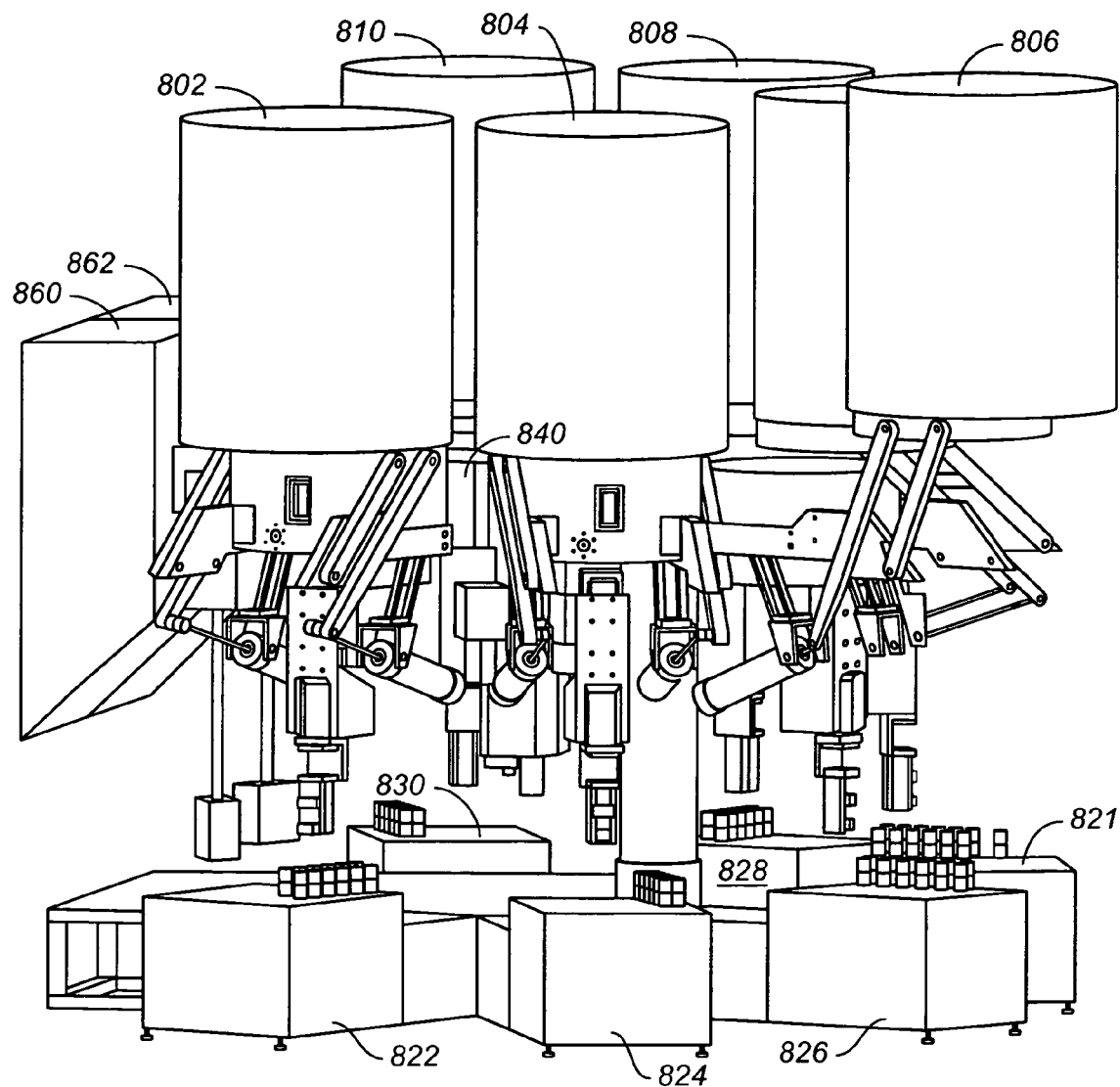
FIG. 4 shows a multi-chamber semiconductor processing system.

Referring now to FIG. 4, a multi-chamber semiconductor processing system 800 is shown. The processing system 800 has a plurality of chambers 802, 804, 806, 808 and 810 adapted to receive and process wafers 842. Controllers 822, 824, 826, 828 and 830 control each of the chambers 802, 804, 808 and 810, respectively. Additionally, a controller 821 controls another chamber, which is not shown for illustrative purposes.

Each of chambers 802-810 provides a lid 104 on the chamber body 102. During maintenance operations, the lid 104 can be actuated into the open position so that components inside the chamber body 102 can be readily accessed for cleaning or replacement as needed.

The chambers 802-810 are connected to a transfer chamber 840 that receives a wafer 842. The wafer 842 rests on top of a robot blade or arm 846. The robot blade 846 receives wafer 842 from an outside processing area.

The transport of wafers 842 between processing areas entails passing the wafers through one or more doors separating the areas. The doors can be load lock chambers 860-862 for passing a wafer-containing container, or wafer boat that can hold about twenty-five wafers in one embodiment. The wafers 842 are transported in the container through the chamber from one area to another area. The load lock can also provide an air circulation and filtration system that effectively flushes the ambient air surrounding the wafers.

Each load lock chamber 860 or 862 is positioned between sealed opening 850 or 852, and provides the ability to transfer semiconductor wafers between fabrication areas. The load locks 860-862 can include an air circulation and filtration system that effectively flushes the ambient air surrounding the wafers. The air within each load lock chamber 860 or 862 can also be purged during wafer transfer operations, significantly reducing the number of airborne contaminants transferred from one fabrication area into the other. The load lock chambers 860-862 can also include pressure sensors 870-872 that take air pressure measurements for control purposes.

During operation, a wafer cassette on a wafer boat is loaded at openings 850-852 in front of the system to a load lock through the load lock doors. The doors are closed, and the system is evacuated to a pressure as measured by the pressure sensors 870-872. A slit valve (not shown) is opened to allow the wafer to be transported from the load lock into the transfer chamber. The robot blade takes the wafer and delivers the wafer to an appropriate chamber. A second slit valve opens between the transfer chamber and process chamber, and wafer is brought inside the process chamber.

Containers thus remain within their respective fabrication areas during wafer transfer operations, and any contaminants clinging to containers are not transferred with the wafers from one fabrication area into the other. In addition, the air within the transfer chamber can be purged during wafer transfer operations, significantly reducing the number of airborne contaminants transferred from one fabrication area into the other. Thus, during operation, the transfer chamber provides a high level of isolation between fabrication stations.

FIG. 5 shows an exemplary apparatus 40 for liquid and vapor precursor delivery using either the system 100 or the system 300. The apparatus 40 includes a chamber 44, such as a CVD chamber. The chamber 40 includes a chamber body that defines an evacuable enclosure for carrying out substrate processing. The chamber body has a plurality of ports including at least a substrate entry port that is selectively sealed by a slit valve and a side port through which a substrate support member can move. The apparatus 40 also includes a vapor precursor injector 46 connected to the chamber 44 and a liquid precursor injector 42 connected to the chamber 40.

In the liquid precursor injector 42, a precursor 60 is placed in a sealed container 61. An inert gas 62, such as argon, is injected into the container 61 through a tube 63 to increase the pressure in the container 61 to cause the copper precursor 60 to flow through a tube 64 when a valve 65 is opened. The liquid precursor 60 is metered by a liquid mass flow controller 66 and flows into a tube 67 and into a vaporizer 68, which is attached to the CVD chamber 71. The vaporizer 68 heats the liquid causing the precursor 60 to vaporize into a gas 69 and flow over a substrate 70, which is heated to an appropriate temperature by a susceptor to cause the copper precursor 60 to decompose and deposit a copper layer on the substrate 70. The CVD chamber 71 is sealed from the atmosphere with exhaust pumping 72 and allows the deposition to occur in a controlled partial vacuum.

In the vapor precursor injector 46, a liquid precursor 88 is contained in a sealed container 89 which is surrounded by a temperature controlled jacket 100 and allows the precursor temperature to be controlled to within 0.1 degree Cent. A thermocouple (not shown) is immersed in the precursor 88 and an electronic control circuit (not shown) controls the temperature of the jacket 100, which controls the temperature of the liquid precursor and thereby controls the precursor vapor pressure. The liquid precursor can be either heated or cooled to provide the proper vapor pressure required for a particular deposition process. A carrier gas 80 is allowed to flow through a gas mass flow controller 82 when valve 83 and either valve 92 or valve 95 but not both are opened. Also shown is one or more additional gas mass flow controllers 86 to allow additional gases 84 to also flow when valve 87 is opened, if desired. Additional gases 97 can also be injected into the vaporizer 68 through an inlet tube attached to valve 79, which is attached to a gas mass flow controller 99. Depending on its vapor pressure, a certain amount of precursor 88 will be carried by the carrier gases 80 and 84, and exhausted through tube 93 when valve 92 is open.

After the substrate has been placed into the CVD chamber 71, it is heated by a heater 100 or 300, as discussed above. After the substrate has reached an appropriate temperature, valve 92 is closed and valve 95 is opened allowing the carrier gases 80 and 84 and the precursor vapor to enter the vaporizer 68 through the attached tube 96. Such a valve arrangement prevents a burst of vapor into the chamber 71. The precursor 88 is already a vapor and the vaporizer is only used as a showerhead to evenly distribute the precursor vapor over the substrate 70. After a predetermined time, depending on the deposition rate of the copper and the thickness required for the initial copper deposition, valve 95 is closed and valve 92 is opened. The flow rate of the carrier gas can be accurately controlled to as little as 1 sccm per minute and the vapor pressure of the precursor can be reduced to a fraction of an atmosphere by cooling the precursor 88. Such an arrangement allows for accurately controlling the copper deposition rate to less than 10 angstroms per minute if so desired. Upon completion of the deposition of the initial copper layer, the liquid source delivery system can be activated and further deposition can proceed at a more rapid rate.

Figure 6A:
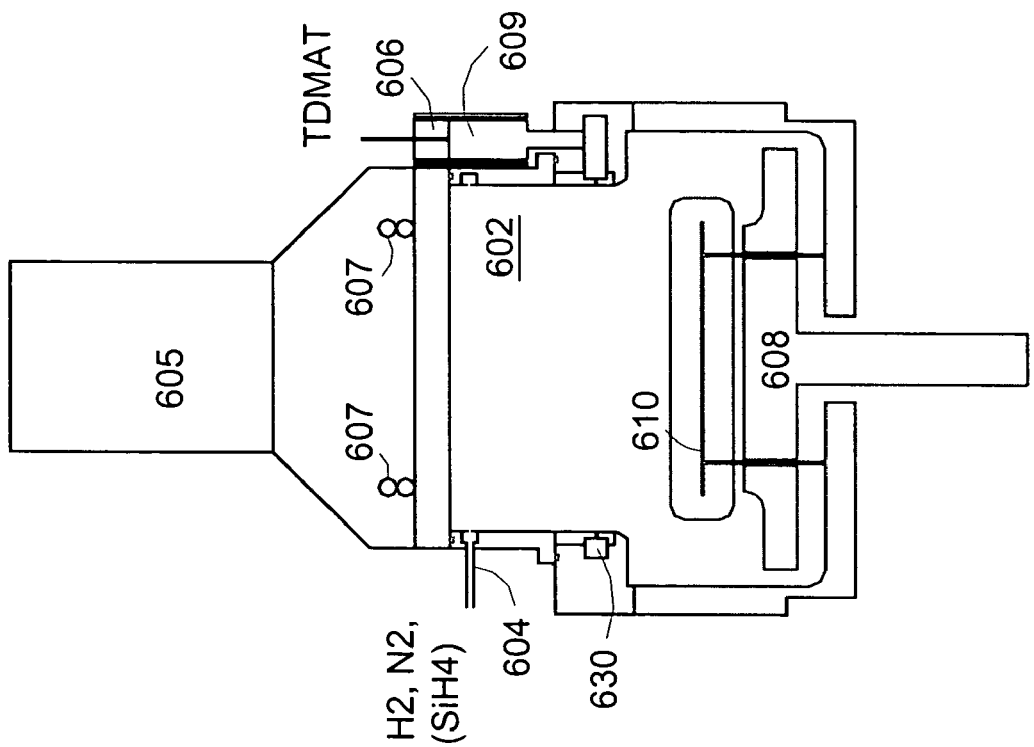
FIGS. 6A-6B show two operating conditions of an embodiment to perform barrier pulsed plasma atomic layer deposition.
Figure 6B:
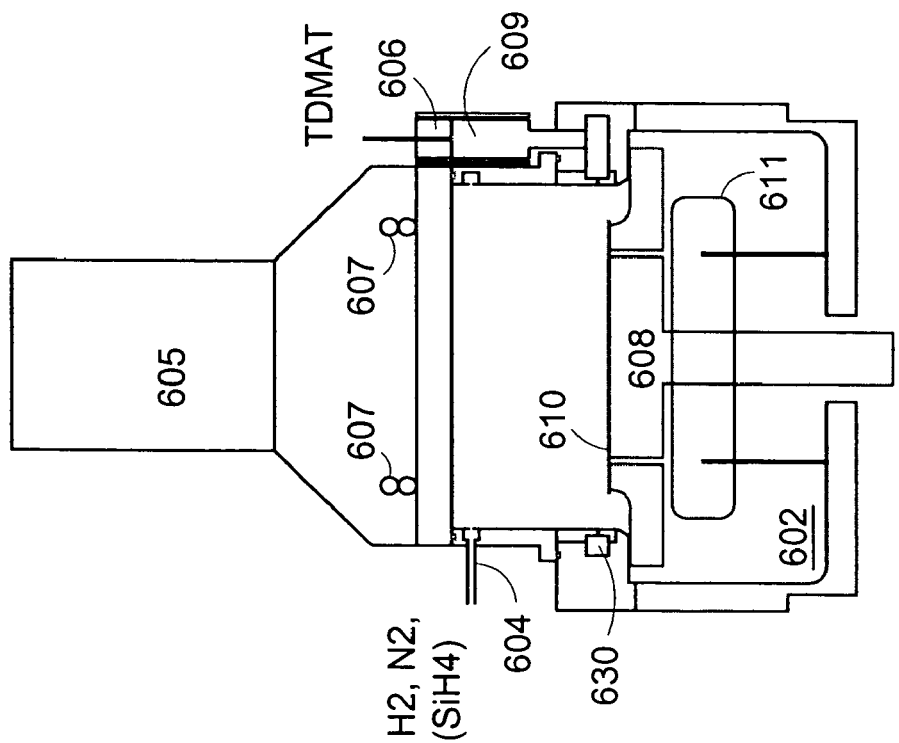

FIGS. 6A-6B show two operating conditions of an embodiment 600 to perform barrier pulsed plasma atomic layer deposition. FIG. 6A shows the embodiment 600 in a deposition condition, while FIG. 6B shows the embodiment 600 in a rest condition. Referring now to FIGS. 6A-6B, a chamber 602 receives gases through one or more gas inlets 604. A solid state plasma generator 605 is mounted on top of the chamber 602 and one or more plasma excitation coils 607 are positioned near the gas inlets 604. A flash bulb 611 is positioned above a substrate 610. A liquid precursor system 606 introduces precursor gases through a vaporizer 609 into the chamber 602 using a precursor distribution ring 630.

A chuck 608 movably supports the substrate 610. In FIG. 6A, the chuck 608 and the substrate 610 are elevated and ready for deposition. The substrate 610 is positioned inside the chamber. Suitable processing gas is introduced into the chamber through the inlets 604, and a pulsed plasma controller 605 is periodically turned on in accordance with a process activation switch to drive the desired process. The particular type of process to be performed affects the process activation switch choice. The choice of activation switch for any device fabrication process, regardless of whether the process is a deposition or etch process, also may significantly affect the final semiconductor device properties. At the conclusion of the processing of one layer of material, the gas in the chamber 602 is purged, and the chamber 602 is ready to accept further processing. This process is repeated for each layer in the multi-layer wafer. At the conclusion of deposition of all layers, the chuck 608 is lowered and the substrate 610 can be removed through an opening 611.

The system allows the substrates to have temperature uniformity through reliable real-time, multi-point temperature measurements in a closed-loop temperature control. The control portion is implemented in a computer program executed on a programmable computer having a processor, a data storage system, volatile and non-volatile memory and/or storage elements, at least one input device and at least one output device.

Each computer program is tangibly stored in a machine-readable storage medium or device (e.g., program memory 522 or magnetic disk) readable by a general or special purpose programmable computer, for configuring and controlling operation of a computer when the storage media or device is read by the computer to perform the processes described herein. The invention may also be considered to be embodied in a computer-readable storage medium, configured with a computer program, where the storage medium so configured causes a computer to operate in a specific and predefined manner to perform the functions described herein.

In CVD (Chemical Vapor Deposition), a gas or vapor mixture is flowed over the wafer surface at an elevated temperature. Reactions then take place at the hot surface where deposition takes place. The basic characteristic of CVD process is the reaction at the substrate of all the precursor vapors together, or a decomposition of the precursors at the substrate surface. The reaction often requires the presence of an energy source such as thermal energy (in the form of resistive heated substrate, or radiative heating), or plasma energy (in the form of plasma excitation).

ALD is a different technique of deposition. In ALD, various vapors are injected into the chamber in alternating and separated sequences. For example, a first precursor vapor is delivered into the chamber to be adsorbed on the substrate. A second precursor vapor is then delivered into the chamber to react with the adsorbed molecules on the substrate to form a desired film. This sequence is repeated for many cycles until the deposited film reaches the desired thickness. There are numerous variations of ALD processes, but the ALD processes all share two common characteristics: sequentially precursor vapor flows with the precursors reacting with the substrate surface, and self-limiting thickness per cycle.

One basic difference between CVD and ALD is the reaction characteristic. In CVD, the precursors react (or decompose) with each other at the substrate surface, while in ALD, the percursors react with the substrate surface, and not with each other.

Another basic difference between CVD and ALD is the self-limiting feature, defining the deposition thickness with respect to time. CVD is not likely to be self-limiting, since the reaction occurs between the precursors at the surface, and, thus, as long as precursors are present, the reaction keeps happening, resulting in an increased deposition thickness with respect to deposition time. In contrast, the maximum thickness per cycle of ALD process is one monolayer because of the self-limiting feature where the substrate surface is saturated with the first precursor. The first precursor can adsorb on the substrate, or the first precursor can have some reaction at the substrate, but the first precursor also saturate the substrate surface and the surface is terminated with a first precursor ligand. A co-pending U.S. application Ser. No. 10/360,135, filed Feb. 4, 2003, entitled "Nanolayer deposition process," and published as U.S. 2004-0151845 on Aug. 5, 2004, is disclosed, and hereby incorporated by reference.

The present invention discloses a method to sequentially deposit a thin film on a substrate comprises the steps of:
   CVD depositing a thin film; and
   treating the thin film to modify the characteristic of the thin film.

These two steps can be accomplished by a flow of precursors. These two steps can be repeated until a desired thickness is achieved.

The deposition step in the present invention is a CVD deposition step, meaning that the precursors either react together or decompose at the substrate surface. Further, the deposition process can have non-self-limiting growth, and, thus, is a function of substrate temperature and process time. There might be a pumping or purging step between these two steps. In a variation of the process, the deposition step can be any deposition step that is non-self-limiting.

The treatment step modifies the already deposited film characteristics. The treatment can treat the deposited film by a modification of film composition, a doping of the deposited film or a removal of impurities from the deposited film. The treatment can also deposit another layer on the deposited film to modify the deposited film characteristics. For example, the additional layer can react with the existing layer to form a compound layer, or can have minimum reaction to form a nanolaminate film. The treatment step can be a plasma treatment, or a temperature treatment, such as rapid thermal treatment with lamp heating.

The steps in the present invention can be any CVD deposition step such as thermal activated CVD, plasma enhanced CVD using parallel plate plasma, or inductive coupled plasma (ICP), or microwave plasma, or remote plasma, or rapid thermal processing using lamp heating. Not only can the deposition step be a deposition step, but also the treatment step can also be a CVD deposition step to modify the deposited film properties.

One advantage of the present invention is the non-self-limiting feature of the first deposition step, allowing the adjustment of the thickness of the deposition step to achieve a higher thickness per cycle. Thus, the thickness per cycle in the present invention is a function of process temperature and process time. Contrastingly, the ALD method is based on the saturation of ligands on the substrate surface, and, therefore, the thickness per cycle is fixed and cannot be changed.

It should be realized that the above examples represent a few of a virtually unlimited number of applications of the plasma processing techniques embodied within the scope of the present invention. Furthermore, although the invention has been described with reference to the above specific embodiments, this description is not to be construed in a limiting sense. For example, the duty ratio, cycle time and other parameters/conditions may be changed in order to obtain a desired characteristic for the wafer.

Various modifications of the disclosed embodiment, as well as alternative embodiments of the invention will become apparent to persons skilled in the art upon reference to the above description. The invention, however, is not limited to the embodiment depicted and described. For instance, the radiation source can be a radio frequency heater rather than a lamp. Hence, the scope of the invention is defined by the appended claims. It is further contemplated that the appended claims will cover such modifications that fall within the true scope of the invention.

What is claimed is:

1. A method to deposit a film in a processing chamber, comprising:
   (a) introducing a first precursor to deposit a thin layer, the deposition process is not self-limiting wherein the deposition thickness increases with deposition time; and
   (b) triggering a flash lamp to generate thermal energy and triggering a plasma source to generate a plasma energy to modify the deposited layer.

2. The method of claim 1, further comprising a step (a1), after step (a), of:
   (a1) purging the first precursor.

3. The method of claim 1, wherein the step (b) further comprising the introduction of a second precursor.

4. The method of claim 3, further comprising a step (b1) after step (b), of:
   (b1) purging the second precursor.

5. The method of claim 1, further comprising a plurality of the steps (a) and (b) until a desired film thickness is reached.

6. The method of claim 2, further comprising a plurality of the steps (a) and (b) until a desired film thickness is reached.

7. The method of claim 4, further comprising a plurality of the steps (a)-(b1) until a desired film thickness is reached.

8. The method of claim 1, wherein the step (a) comprises using plasma energy in the deposition process.

9. The method of claim 1, wherein the first precursor in step (a) comprises a CVD precursor.

10. The method of claim 3, wherein the second precursor in step (b) comprises process gases, selected from a group consisting of nitrogen, oxygen, hydrogen, ammonia, $NF_3$, silane, ozone, argon.

11. The method of claim 3, wherein the second precursor in step (b) comprises a CVD precursor.

12. A method to deposit a film in a processing chamber, comprising:
   (a) introducing a first precursor to deposit a thin layer, the deposition process is not self-limiting wherein the deposition thickness increases with deposition time; and
   (b) introducing a second precursor comprising process gases selected from a group consisting of nitrogen, oxygen, hydrogen, ammonia, $NF_3$, silane, ozone, argon; and
   (c) either
      triggering a flash lamp to generate thermal energy to modify the deposited layer; or
      triggering a plasma source to generate a plasma energy to modify the deposited layer; or
      triggering a flash lamp to generate thermal energy and triggering a plasma source to generate a plasma energy to modify the deposited layer.

13. The method of claim 12, further comprising:
   step (a1) after step (a) of purging the first precursor; and
   step (c1) after step (c) of purging the second precursor.

14. The method of claim 12, further comprising a plurality of the steps (a) through (c) until a desired film thickness is reached.

15. The method of claim 13, further comprising a plurality of the steps (a) through (c1) until a desired film thickness is reached.

16. A method to deposit a film in a processing chamber, comprising:
   (a) introducing a first precursor to deposit a thin layer, the deposition process is not self-limiting wherein the deposition thickness increases with deposition time;
   (b) triggering a flash lamp to generate thermal energy; and
   (c) triggering a plasma source to generate a plasma energy to modify the deposited layer;
   wherein triggering the flash lamp and triggering the plasma source are performed either sequentially or contemporaneously.

17. The method of claim 16, further comprising:
   step (a1) after step (a), of purging the first precursor; and
   step (a2) after step (a1) of introducing a second precursor, step (b1) after step (b) of purging the second precursor.

18. The method of claim 16, further comprising a plurality of the steps (a) through (c) until a desired film thickness is reached.

19. The method of claim 17, further comprising a plurality of the steps (a) through (c) until a desired film thickness is reached.

20. The method of claim 17, wherein the second precursor comprises one or more process gases selected from a group consisting of nitrogen, oxygen, hydrogen, ammonia, $NF_3$, silane, ozone, and argon.

* * * * *